(12) United States Patent
Kanayama et al.

(10) Patent No.: US 10,414,190 B2
(45) Date of Patent: Sep. 17, 2019

(54) PRINTING PLATE, PRINTING DEVICE INCLUDING PRINTING PLATE AND METHOD FOR MANUFACTURING LAMINATED CERAMIC ELECTRONIC COMPONENT

(71) Applicant: MURATA MANUFACTURING CO., LTD., Kyoto-fu (JP)

(72) Inventors: Yoshihiro Kanayama, Nagaokakyo (JP); Shinichi Kokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 259 days.

(21) Appl. No.: 15/375,845

(22) Filed: Dec. 12, 2016

(65) Prior Publication Data
US 2017/0173989 A1     Jun. 22, 2017

(30) Foreign Application Priority Data
Dec. 21, 2015 (JP) .................. 2015-248743

(51) Int. Cl.
| | | |
|---|---|---|
| *B41N 1/22* | (2006.01) | |
| *B41N 1/00* | (2006.01) | |
| *H01G 4/33* | (2006.01) | |
| *H01G 4/30* | (2006.01) | |
| *H01G 4/008* | (2006.01) | |
| *H01G 4/012* | (2006.01) | |

(Continued)

(52) U.S. Cl.
CPC ............. *B41N 1/00* (2013.01); *H01G 4/0085* (2013.01); *H01G 4/012* (2013.01); *H01G 4/30* (2013.01); *H01G 4/33* (2013.01); *H05K 1/11* (2013.01); *H05K 3/12* (2013.01); *B41N 1/16* (2013.01); *H01G 4/12* (2013.01)

(58) Field of Classification Search
CPC ........................................................ B41N 1/22
USPC ........................................................ 101/150
See application file for complete search history.

(56) References Cited

U.S. PATENT DOCUMENTS 2,166,367 A * 7/1939 Norris .................. B07B 1/4618
                                                    101/150
3,086,879 A * 4/1963 Lassiter .................. C23C 2/006
                                                    101/150

(Continued)

FOREIGN PATENT DOCUMENTS

JP      2004-207641 A      7/2004
JP      2006-095803 A      4/2006

(Continued)

OTHER PUBLICATIONS

An Office Action; "Notice of Preliminary Rejection," issued by the Korean Patent Office dated Jul. 19, 2017, which corresponds to Korean Patent Application No. 10-2016-0169869 and is related to U.S. Appl. No. 15/375,845; with English language translation.

*Primary Examiner* — Anthony H Nguyen
(74) *Attorney, Agent, or Firm* — Studebaker & Brackett PC

(57) ABSTRACT

A printing plate which can form a graphic pattern having excellent linearity of a side edge along the printing direction and a good planarization property in the case of forming a graphic pattern in which a width direction dimension, a dimension in a direction orthogonal to the printing direction, is small; a printing device including the printing plate; and a method for manufacturing a laminated ceramic electronic component.

12 Claims, 20 Drawing Sheets

(51) Int. Cl.
*H05K 1/11* (2006.01)
*H05K 3/12* (2006.01)
*H01G 4/12* (2006.01)
*B41N 1/16* (2006.01)

(56) References Cited

U.S. PATENT DOCUMENTS

| | | | | |
|---|---|---|---|---|
| 5,033,377 | A | * | 7/1991 | Shimizu .................... G03F 5/20 |
| | | | | 101/150 |
| 7,063,014 | B2 | | 6/2006 | Hashimoto et al. |
| 7,481,162 | B2 | | 1/2009 | Takashima et al. |
| 2004/0209197 | A1 | * | 10/2004 | Hashimoto ............. B41F 13/11 |
| | | | | 430/320 |
| 2007/0107611 | A1 | * | 5/2007 | Takashima ................ B41F 9/00 |
| | | | | 101/153 |
| 2009/0266254 | A1 | * | 10/2009 | Shigeta .................... B41C 1/18 |
| | | | | 101/352.11 |
| 2012/0129208 | A1 | * | 5/2012 | Khine ................... B01L 3/5085 |
| | | | | 435/29 |

FOREIGN PATENT DOCUMENTS

| | | |
|---|---|---|
| JP | 2006-110916 A | 4/2006 |
| JP | 2012-056143 A | 3/2012 |
| JP | 2012-071533 A | 4/2012 |
| JP | 2012-142451 A | 7/2012 |

\* cited by examiner

PRINTING PLATE, PRINTING DEVICE INCLUDING PRINTING PLATE AND METHOD FOR MANUFACTURING LAMINATED CERAMIC ELECTRONIC COMPONENT

CROSS REFERENCE TO RELATED APPLICATIONS

This application claims benefit of priority to Japanese Patent Application 2015-248743 filed Dec. 21, 2015, the entire content of which is incorporated herein by reference.

TECHNICAL FIELD

The present disclosure relates to a printing plate such as a gravure printing plate, a printing device and a method for manufacturing a laminated ceramic electronic component, and particularly to a printing plate which is used, for example, in a manufacturing process of an electronic component, for applying a printing paste such as a conductive paste or a ceramic paste onto a printing object such as a ceramic green sheet, a printing device including the printing plate and a method for manufacturing a laminated ceramic electronic component.

BACKGROUND

As a method of forming an internal electrode or a wiring circuit in manufacturing a multilayer ceramic capacitor including an internal electrode for forming a capacitance or a ceramic multilayer substrate including a wiring circuit, for example, a method such as a gravure printing method in which a conductive paste is applied onto a ceramic green sheet using a printing plate for intaglio printing, is widely known.

In addition, a method in which printing is performed using a printing plate for intaglio printing as described above is also widely applied, as a method of applying a ceramic paste or a resistance paste, to the case where an insulating film or a resistance film is formed in a manufacturing process of an electronic component.

By the way, as a conductive paste for formation of an electrode of an electronic component, for example, a conductive paste having viscosity of about 1 to 40 Pa·s is used.

Since the conductive paste is appropriately selected in accordance with characteristics of the electronic component as a product and used, the viscosity of the conductive paste varies depending on a type of the electronic component. In applying a conductive paste having a wide viscosity range, it is actually difficult to print so as to obtain an intended graphic pattern (printing coating) when using a printing plate having a printing pattern which is the same across the board.

That is, in order to print so as to obtain an intended graphic pattern by applying a conductive paste varying in viscosity, a printing plate including a printing pattern to fit the viscosity of the conductive paste is required. However, there is a problem that it is not easy to match a conductive paste with a printing pattern.

Further, in recent years, a range of the viscosity of a conductive paste to be used for printing becomes as wide as 0.01 to 80 Pa·s, and thus smoothness and a planarization property of a printed coating are deteriorated.

As a technology concerned with such gravure printing, JP-A-2006-110916 discloses a plate for gravure printing in which a plurality of printing patterns corresponding to the graphic pattern to be printed is formed on an outer periphery of a cylindrical gravure roll, and printing patterns are formed by arranging, parallel to one another, a plurality of printing-direction banks having a flection and extending substantially along a printing direction.

Furthermore, JP-A-2006-110916 discloses that an angle θ of a flection 112 of a printing-direction bank 113 constituting a printing pattern P1 is acute as shown in FIG. 17 or a shape of a flection 112 of a printing pattern P1 is curved as shown in FIG. 18. In addition, in the printing pattern P1 in FIG. 17 and FIG. 18, a direction indicated by arrow A is a printing direction.

However, in the case of the gravure printing plate of JP-A-2006-110916, there is a problem that behaviors of transferring/misting of the conductive paste at a flection (turn back portion) 112 vary depending on the viscosity of the conductive paste and variations in a printing thickness and smoothness of a coated film result.

Further, in order to prevent the so-called saddle phenomenon that a peripheral portion of the graphic pattern formed by applying the conductive paste upsurges, a width of the printing-direction bank 113 is increased (that is, a large width portion 113a is provided) in a surrounding region of the printing pattern P1 as shown in FIG. 17 and FIG. 18; however, in JP-A-2006-110916, there is a problem that the linearity of an outer periphery of a graphic pattern printed is deteriorated since the printing pattern P1 is a flection pattern as described above.

Further, in the case of the gravure printing plate of JP-A-2006-110916, when a narrow graphic pattern in which a width direction dimension, a dimension in a direction orthogonal to the printing direction (direction indicated by arrow A), is, for example, 200 μm or less, is formed, the linearity of a side edge parallel to the printing direction tends to be deteriorated.

Further, as a conventional printing pattern, for example, as shown in FIG. 19, a printing pattern P2 having a configuration in which a plurality of rectangular cells 121 are consecutively arranged and neighboring cells are separated by a bank 122, is conceived. However, the printing pattern P2 thus configured has a problem that it is hard to form a smooth printed film of a conductive paste of high viscosity.

Thus, in order to solve such a problem, a printing pattern P3 in which as shown in FIG. 20, a notch 133 is formed at alternate positions along the printing direction of a bank 132 separating cells 131 adjacent to each other in the printing direction (direction indicated by arrow A), is conceived, and put into practical use. In the case of this printing pattern P3, the conductive paste filled into the cell 131 is transferred while stably generating, over the bank 132, misting from the cell 131 to a printing object in being printed (transferred) to the printing object such as a ceramic green sheet, and therefore it is possible to ensure the smoothness of a printed graphic pattern.

However, in the case of the printing pattern P3, there is a problem that this printing pattern cannot adapt to a narrow graphic pattern having a small dimension in a width direction since the above-mentioned structure in which a plurality of cells are arranged in a direction orthogonal to the printing direction cannot be realized when a dimension in a width direction (dimension in a direction orthogonal to the printing direction) of the graphic pattern (printing figure) formed by applying the printing paste is reduced.

Further, JP-A-2012-71533 also proposes, but it is not particularly shown, a printing pattern in which end banks are formed at ends on both sides in a direction orthogonal to the printing direction and a plurality of banks are also arranged in a central region in a direction orthogonal to the printing direction. However, in the case of the printing pattern, there is also a problem that this printing pattern cannot adapt to a narrow graphic pattern having a small dimension in a width direction.

SUMMARY

The present disclosure solves the above-mentioned problems, and it is an object of the present disclosure to provide a printing plate which can form a graphic pattern having excellent linearity of a side edge along the printing direction and a good planarization property, for example, in the case of forming a graphic pattern such as an internal electrode pattern by applying a conductive paste, particularly in the case of forming a graphic pattern in which a dimension in a direction orthogonal to the printing direction (width direction dimension) is small; a printing device including the printing plate; and a method for manufacturing a laminated ceramic electronic component.

In order to solve the above-mentioned problems, a printing plate of the present disclosure is
  a printing plate for intaglio printing for applying a printing paste onto a printing object so as to form a predetermined graphic pattern,
  wherein a plurality of printing patterns corresponding to the graphic pattern to be printed is formed on a surface of a plate material,
  the printing pattern includes a plurality of banks on one side protruding from an edge on one side along a printing direction in which printing is advanced toward an edge on the other side opposite to the edge on one side and arranged at predetermined intervals in the printing direction, a plurality of banks on the other side protruding from the edge on the other side toward the edge on one side and arranged at predetermined intervals in the printing direction, and a cell portion being a region to be filled with the printing paste, the region except for regions occupied by the banks on one side and the banks on the other side.

In the present disclosure, it is preferred that the banks on one side and the banks on the other side protrude in a direction orthogonal to the printing direction toward the edge on the other side and the edge on one side, respectively.

When the banks on one side and the banks on the other side protrude in a direction orthogonal to the printing direction toward the opponent banks on the other side and edge on one side, respectively, it becomes possible to stably generate consecutive misting of the printing paste at a base end portion of the banks on one side and a base end portion of the banks on the other side, and it becomes possible to certainly form a graphic pattern (printing figure) having excellent linearity of a side edge along the printing direction and a good planarization property.

Further, it is preferred that each of the plurality of banks on one side and each of the plurality of banks on the other side are arranged at a position confronting each other in a direction orthogonal to the printing direction.

By employing the above-mentioned configuration, misting of the printing paste can be stably generated, and the present disclosure can become more effective.

Further, each of the plurality of banks on one side and each of the plurality of banks on the other side are preferably arranged at a position not confronting each other in a direction orthogonal to the printing direction.

In the printing plate of the present disclosure, it is also possible to arrange each of banks on one side and each of banks on the other side at a position not confronting each other in a direction orthogonal to the printing direction.

With this configuration, it is possible to narrow a width of the printing pattern while ensuring a spacing between the banks required for performing good printing, that is, a spacing of between the bank on one side and the bank on the other side, a spacing between the banks on one side and a spacing between the banks on the other side. As a result of this, it becomes possible to form a narrow graphic pattern (printing figure) in which a dimension in a direction orthogonal to the printing direction is 100 μm or less, particularly about 30 μm, which is difficult in the case of making the bank on one side confront the bank on the other side, while ensuring the linearity of a side edge along the printing direction and the uniformity of a thickness.

In addition, as an aspect in which the banks on one side and the banks on the other side are arranged not to confront each other, an aspect in which both banks are arranged such that each of the banks on one side is positioned intermediate between banks on the other side arranged at predetermined intervals in the printing direction and each of the banks on the other side is positioned intermediate between banks on one side arranged at predetermined intervals in the printing direction, is exemplified; however, each bank may be arranged at a position deviated from an intermediate point.

Further, the printing pattern is preferably configured such that a tip of the bank on one side does not overlap a tip of the bank on the other side in viewing the printing pattern in a direction along the printing direction.

When the printing pattern is configured such that a tip of the bank on one side does not overlap a tip of the bank on the other side in viewing the printing pattern in a direction along the printing direction, a cell portion where both of the bank on one side and the bank on the other side do not exist is formed along the printing direction on the inner side in a direction orthogonal to the printing direction of the cell portion, and therefore, it is possible to secure an adequate amount of a printing paste to be filled into the cell portion to form a graphic pattern having a required thickness.

Further, the printing pattern is preferably configured such that a tip of the bank on one side overlaps a tip of the bank on the other side in viewing the printing pattern in a direction along the printing direction.

When the printing pattern is configured such that a tip of the bank on one side overlaps a tip of the bank on the other side in viewing the printing pattern in a direction along the printing direction, it becomes possible to configure a printing pattern suitable for the formation of a graphic pattern (printing figure) in which a dimension in a direction orthogonal to the printing direction is small.

Further, the tips of the banks on one side and the tips of the banks on the other side preferably bend toward an upstream side of the printing direction.

When the tips of the banks on one side and the tips of the banks on the other side are bent toward an upstream side of the printing direction, misting of the printing paste during transferring becomes smooth, and this enables a shape of the graphic pattern formed by applying the printing paste to be stabilized and the planarization property (uniformity of a thickness) to be improved.

Further, it is also possible to configure such that dimensions of the banks on one side adjacent to each other which are directed from base end portions toward the edge on the other side are different, and dimensions of the banks on the other side adjacent to each other which are directed from base end portions toward the edge on one side are different.

When the graphic pattern is configured so as to make the dimensions of the banks on one side adjacent to each other which are directed from base end portions to the edge on the other side different, and so as to make the dimensions of the banks on the other side adjacent to each other which are directed to the edge on one side different, a state of misting of the printing paste can be stabilized regardless of properties of the printing paste and printing conditions to enable highly reliable printing to be performed.

Further, the printing pattern is preferably configured such that spacings between the banks on one side are constant and spacings between the banks on the other side are constant.

When each of the banks on one side and the banks on the other side is arranged at regular intervals in a printing direction, a state of misting of the printing paste can be stabilized regardless of a position in the printing pattern to enable highly reliable printing to be performed.

Further, it is preferred that a recessed portion which is deeper than other regions is formed in part of a bottom of the cell portion.

When a recessed portion which is deeper than other regions is provided in a region of a bottom of the cell portion, an amount of a printing paste to be filled into the cell portion can be increased and a graphic pattern having a large thickness of coated film can be formed.

Further, the printing device of the present disclosure is characterized by including the above-mentioned printing plate of the present disclosure.

Further, a method for manufacturing a ceramic electronic component of the present disclosure is characterized by including a step of applying a conductive paste as a printing paste, onto a ceramic green sheet or a carrier film using the above-mentioned printing plate of the present disclosure to form a graphic pattern for an internal electrode.

In the printing plate of the present disclosure, the printing pattern includes a plurality of banks on one side protruding from an edge on one side along a printing direction toward an edge on the other side opposite to the edge on one side and arranged at predetermined intervals in the printing direction, and a plurality of banks on the other side protruding from the edge on the other side toward the edge on one side and arranged at predetermined intervals in the printing direction, and a region excluding regions occupied by the banks on one side and the banks on the other side is designated as a cell portion being a region to be filled with the printing paste. Therefore, applying a printing paste using the printing plate of the present disclosure enables to stably generate consecutive misting in transferring (applying) a printing paste from a cell portion to a printing object such as a ceramic green sheet. As a result of this, the graphic pattern (printing figure) formed by applying the printing paste has excellent linearity of a side edge along the printing direction, a good planarization property and a uniform thickness.

That is, in order to obtain a graphic pattern which is excellent in the linearity of a side edge along the printing direction and the good planarization property, it is important to stably generate misting in each cell during transferring of the printing paste from the printing pattern. In accordance with the printing plate of the present disclosure, misting in transferring of the printing paste is consecutively generated in base end portions of the banks on one side and the banks on the other side respectively constituting the printing pattern, that is, an edge on one side and an edge on the other side of the printing pattern, and then, the printing paste is transferred to a printing object together from one cell throughout the printing pattern. Therefore it becomes possible to consecutively generate misting stably compared with use of the printing plate not provided with the banks on one side and the banks on the other side.

Further, since such consecutive misting is stably generated, a graphic pattern (printing figure) having excellent linearity of a side edge along the printing direction and a good planarization property is obtained.

Further, since the printing pattern includes the banks on one side and the banks on the other side and the region excluding regions occupied by the banks on one side and the banks on the other side is designated as a cell portion to be filled with the printing paste, the printing plate of the present disclosure can be suitably used for the case of forming a narrow graphic pattern in which a dimension (width) in a direction orthogonal to the printing direction is, for example, about 200 µm, and in this case, a graphic pattern having excellent linearity of a side edge along the printing direction and a good planarization property can be formed.

A printing device of the present disclosure includes the above-mentioned printing plate, and therefore by applying a printing paste using the printing device, a graphic pattern having excellent form accuracy and a uniform thickness can be formed with high efficiency.

Further, a method for manufacturing a laminated electronic component of the present disclosure includes a step of applying a conductive paste onto a ceramic green sheet or a carrier film as a printing paste using the above-mentioned printing plate to form a graphic pattern for formation of an internal electrode, and therefore a laminated ceramic electronic component including an internal electrode having excellent form accuracy and a uniform thickness can be formed with high efficiency.

DETAILED DESCRIPTION

Hereinafter, embodiments of the present disclosure are shown, and features of the present disclosure will be described in more detail. In addition, in the present embodiment, a printing plate for intaglio printing (gravure printing plate) provided on the surface of a gravure roll which is used for gravure printing will be described as an example.

First Embodiment

Figure 1:
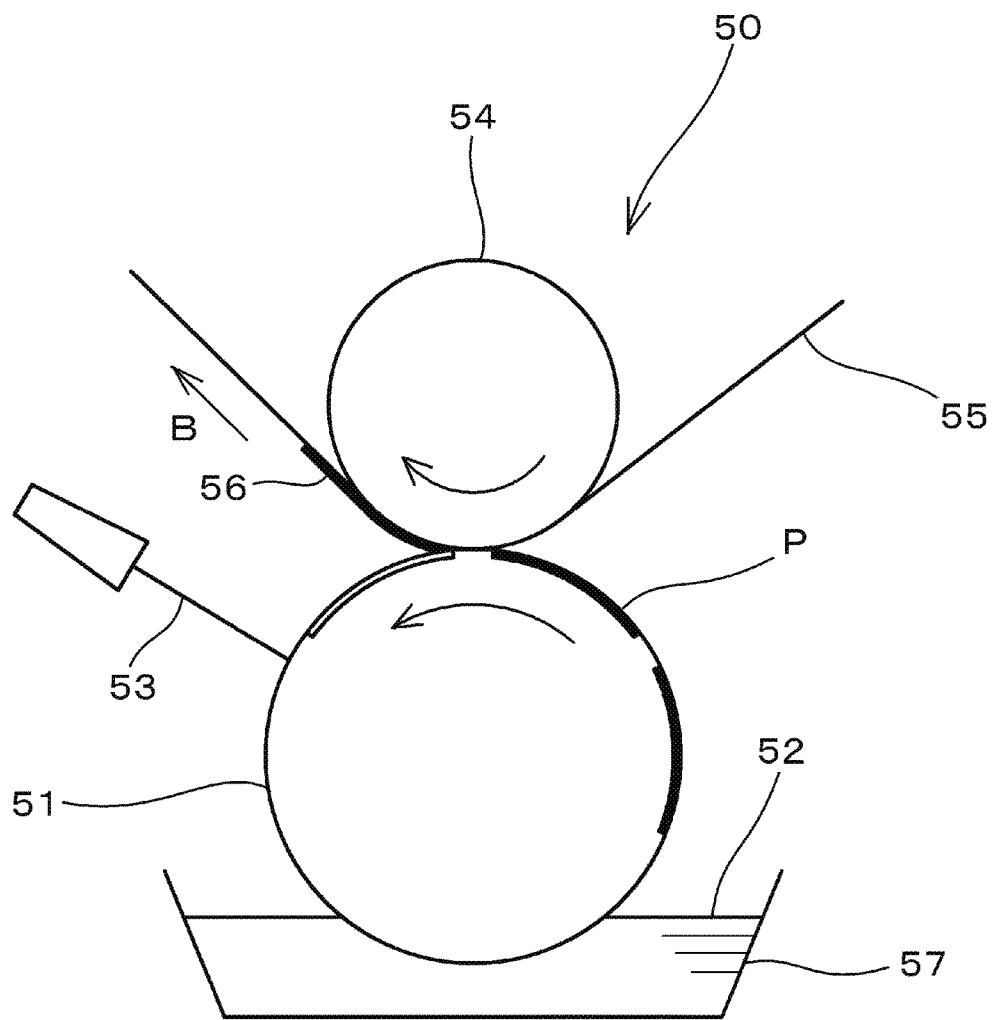
FIG. 1 is a view for explaining a constitution of a printing device of an embodiment of the present disclosure.
Figure 2:
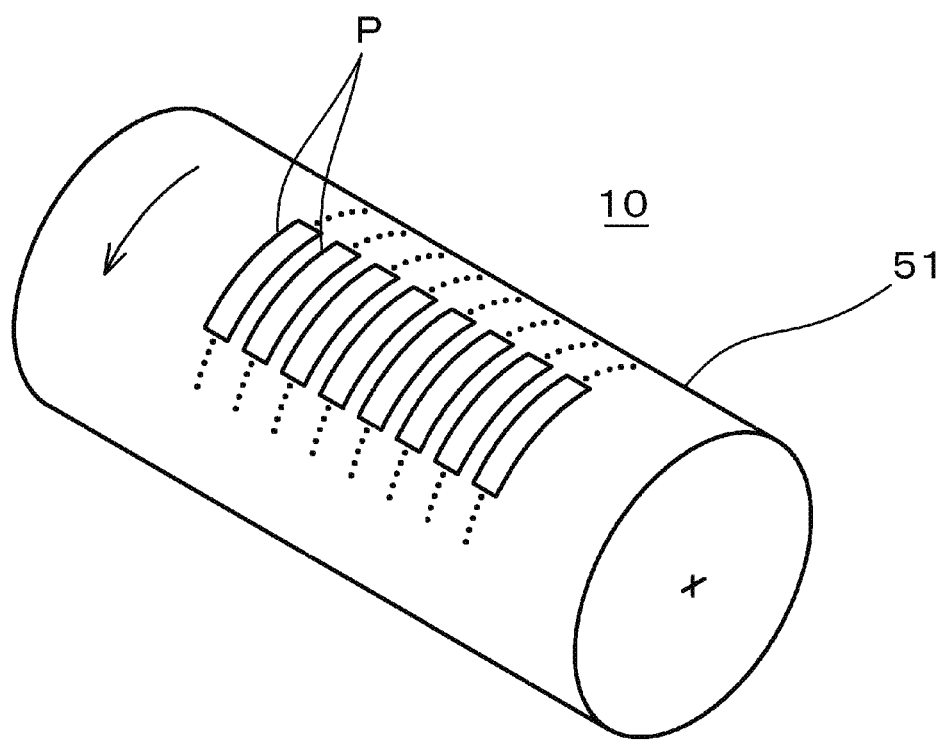
FIG. 2 is a view showing a gravure roll to be used in a printing device shown in FIG. 1.

FIG. 1 is a view showing a schematic constitution of a gravure printing device using a printing plate of an embodiment of the present disclosure, and FIG. 2 is a perspective view showing a gravure roll constituting the gravure printing device of FIG. 1.

A gravure printing device 50 is a printing device which is used for applying a conductive paste (printing paste) 52 for formation of an internal electrode onto a ceramic green sheet 55 to form an internal electrode pattern (graphic pattern) 56 in a manufacturing process of an electronic component such as a multilayer ceramic capacitor including a narrow internal electrode.

The printing device 50 includes, as shown in FIG. 1 and FIG. 2, a gravure roll 51 provided with a plurality of printing patterns P on the surface, a paste tank 57 which accommodate the conductive paste 52, a scraping device 53 which scrapes an excessive conductive paste 52 adhering to the gravure roll 51, a back roll (pressure body) 54, and a conveying device (not shown) such as a conveying roll for conveying a ceramic green sheet (printing object) 55 in a direction of arrow B.

The printing device 50 is configured such that the ceramic green sheet 55 is passed between the gravure roll 51 and the back roll 54 to transfer the conductive paste 52 held in a printing pattern P on the surface of the gravure roll 51 to the surface of the ceramic green sheet 55, and thereby an internal electrode pattern 56 can be printed on the ceramic green sheet 55.

A printing plate 10 of the first embodiment uses a cylindrical gravure roll 51 as a plate material and is formed by arranging a plurality of printing patterns P on an outer periphery of the gravure roll 51.

In addition, the printing direction of the printing paste 56 is a direction (direction indicated by arrow A in FIG. 1, FIG. 3) opposite to a conveying direction (direction indicated by arrow B in FIG. 1) of the ceramic green sheet 55.

Figure 3:
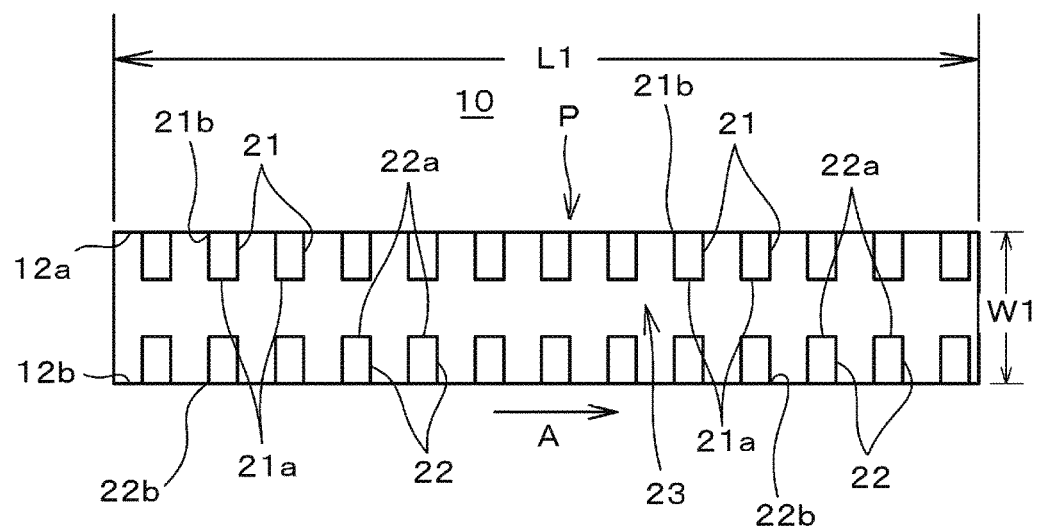
FIG. 3 is a view showing a printing pattern constituting a printing plate of an embodiment of the present disclosure.

As shown in FIG. 3, the printing pattern P includes a plurality of banks on one side 21 protruding from an edge on one side 12a of a pair of edges along a printing direction (direction indicated by arrow A) toward an edge on the other side 12b opposite to the edge on one side 12a and a plurality of banks on the other side 22 protruding from the edge on the other side 12b toward the edge on one side 12a. Further, a region excluding regions occupied by the banks on one side 21 and the banks on the other side 22 is designated as a cell portion 23 being a region to be filled with the printing paste 52 (refer to FIG. 1).

The printing plate 10 is suitably used in printing a rectangular graphic pattern 56 in which a dimension (width) in a direction orthogonal to the printing direction is 50 μm or more and 200 μm or less and a dimension (length) in the printing direction is 500 μm or more as the graphic pattern 56 to be formed on a printing object such as a ceramic green sheet.

Then, the printing pattern P constituting the printing plate 10 is preferably configured such that a width W1, a dimension in a direction orthogonal to the printing direction, is 50 μm or more and 200 μm or less and a length L1, a dimension in the printing direction, is 500 μm or more in order to correspond to a width of the above-mentioned graphic pattern 56.

Further, a depth of a cell portion 23 of the printing pattern P is preferably 5 μm or more and 50 μm or less.

Further, in the printing pattern P constituting the printing plate 10, the banks on one side 21 and the banks on the other side 22 protrude in a direction orthogonal to the printing direction toward the edge on the other side 12b and the edge on one side 12a, respectively, and each of the plurality of banks on one side 21 and each of the plurality of banks on the other side 22 are arranged at a position confronting each other.

Further, the plurality of banks on one side 21 protruding from an edge on one side 12a toward an edge on the other side 12b, and the plurality of banks on the other side 22 protruding from the edge on the other side 12b toward the edge on one side 12a are arranged at regular intervals (with predetermined pitches) in the printing direction.

Further, a length (a dimension in a direction orthogonal to the printing direction) of each of the banks on one side 21 is preferably set to 30% or more and 200% or less of an arrangement pitch of the banks on one side 21, and a length of each of the banks on the other side 22 is preferably set to 30% or more and 200% or less of an arrangement pitch of the banks on the other side 22.

In addition, specifically, it is preferred that widths of the banks on one side 21 and the banks on the other side 22 are set to, for example, 3 to 30 μm, and lengths are set to 10 μm at the shortest and a value obtained by subtracting 15 μm from one-half of a width of the graphic pattern 56 at the longest.

Further, the arrangement pitches of the bank on one side 21 and the bank on the other side 22 adjacent to each other in the printing direction are preferably in the range of a value obtained by adding 30 μm to the widths of the bank on one side 21 and the bank on the other side 22, as a minimum value, to 100 μm as a maximum value.

In addition, a distance between tip portions 21a and 22a, opposite to each other, of the bank on one side 21 and the bank on the other side 22 (a spacing between tip portions 21a and 22a) is preferably 30 μm or more.

Further, a distance between an end on a beginning side of printing (left-side end in FIG. 3) of the printing pattern P and a bank, which is the closest to the end on a beginning side of printing, of the banks on one side 21 or the banks on the other side 22, is preferably equal to or smaller than the arrangement pitches of the banks on one side 21 and the banks on the other side 22.

Further, a distance between an end on an ending side of printing (right-side end in FIG. 3) of the printing pattern P and a bank, which is the closest to the end on an ending side of printing, of the banks on one side 21 or the banks on the other side 22, is preferably set to at most one-half of the arrangement pitches of the banks on one side 21 and the banks on the other side 22.

By using the printing plate 10 of the first embodiment which has the above-mentioned configuration, it is possible to form a graphic pattern 56 (FIG. 1) in which a dimension (width) in a direction orthogonal to the printing direction is 50 μm to 200 μm and which has excellent linearity of a side edge (lateral side) along the printing direction and a good planarization property.

In addition, the above-mentioned banks on one side 21 and banks on the other side 22 become triggers of applying (transferring) a printing paste 52 to a ceramic green sheet 55 and the printing paste 52 in the cell 23 (FIG. 3) spreads out over the ceramic green sheet 55 through the banks on one side 21 and the banks on the other side 22, and simultaneously the printing paste 52 is taken up from the cell portion 23 in transferring the printing paste (conductive paste) 52 to a ceramic green sheet 55 using a printing plate 10 having the above-mentioned configuration (refer to FIG. 1).

Then, the printing paste 52 transferred along the banks on one side 21 and the banks on the other side 22 generates misting in the printing direction at the edges of the edge on one side 12*a* and the edge on the other side 12*b* of the printing pattern P when the printing plate 10 and the ceramic green sheet are separated. Thereby, the printing paste 52 is linearly transferred more at the edge on one side 12*a* and the edge on the other side 12*b* of the printing pattern P.

Moreover, when leveling progresses after applying (transferring) the printing paste to the ceramic green sheet 55, the linearity of a side edge along the printing direction of the graphic pattern 56 is improved.

Further, since the banks on one side 21 and the banks on the other side 22 have constant arrangement pitches and arranged at regular intervals, a transferred amount of the printing paste 52 is stabilized and the smoothness of the graphic pattern 56 is enhanced.

In addition, a spacing between the bank on one side 21 and the bank on the other side 22, and spacings between the banks on one side 21 and between the banks on the other side 22 are preferably 30 μm or more. When these spacings are less than 30 μm, misting of the printing paste 52 during transferring becomes unstable, resulting in deterioration of printability.

In addition, a transferred amount/a leveling property of the printing paste 52 vary depending on properties of the printing paste 52, and in the printing plate of the first embodiment, a smoother graphic pattern 56 can be attained by adjusting lengths and arrangement pitches of the banks on one side 21 and the banks on the other side 22 in accordance with the properties of the printing paste 52.

Further, in the graphic pattern 56 formed by applying the printing paste 52, it is important that an upper surface of the pattern is flat and it is also important that a rise of a peripheral portion (edge portion) is steep, and when the printing plate 10 of the first embodiment is used, and a thickness of coated film in the edge portion is made to be larger than a thickness of a center of the graphic pattern 56 by controlling a pattern of the banks on one side 21 and the banks on the other side 22, a graphic pattern which is flat and has a peripheral portion (edge portion) with a steep rise can be obtained.

In addition, when a peripheral portion (edge portion) of the graphic pattern is smooth and is not steep, it is not preferred since sometimes a region, having a certain thickness or less, of the graphic pattern does not perform the intended function.

Second Embodiment

Figure 4:
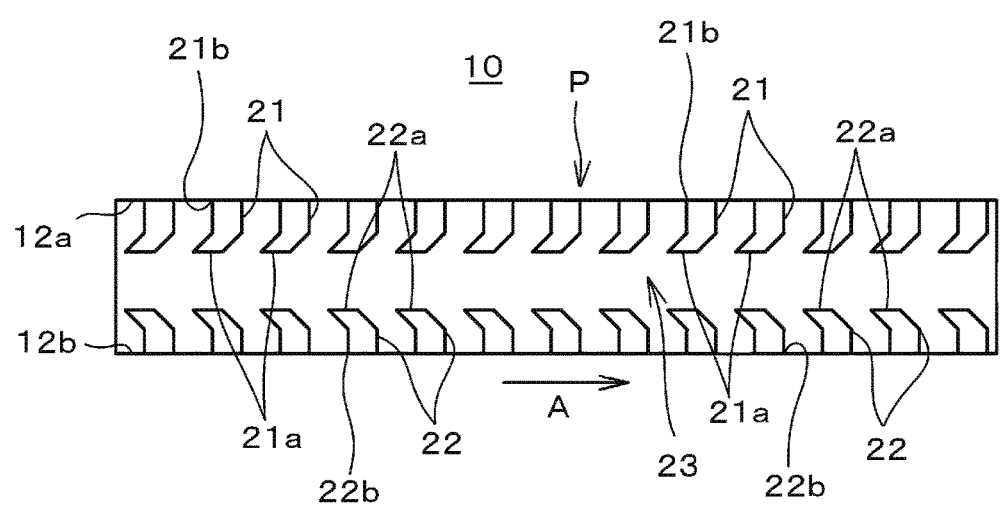
FIG. 4 is a view showing another example of a printing pattern constituting a printing plate of an embodiment of the present disclosure.

FIG. 4 is a view showing a printing plate of another embodiment (the second embodiment) of the present disclosure.

A printing pattern P constituting a printing plate 10 of the second embodiment, as shown in FIG. 4, includes banks on one side 21 and banks on the other side 22 respectively configured such that tip portions 21*a* and 22*b* bend toward an upstream side of a printing direction (beginning side of printing).

In addition, bending angles of tip portions 21*a* and 22*a* of the bank on one side 21 and the bank on the other side 22 are preferably set to 0° or more to 90° or less with respect to a direction orthogonal to the printing direction.

In the case of the printing pattern P of FIG. 4, a spacing between the bank on one side 21 and the bank on the other side 22, and spacings between the banks on one side 21 and between the banks on the other side 22 are also preferably 30 μm or more. When these spacings are less than 30 μm, misting of the printing paste during transferring becomes unstable, resulting in deterioration of printability.

When the tip portions 21*a* of the banks on one side 21 and the tip portions 22*a* of the banks on the other side 22 are bent toward the upstream side of the printing direction (beginning side of printing) like in this second embodiment, a length of a trigger of transferring can be lengthened in transferring a printing paste filled into a cell portion 23 to a ceramic green sheet 55 to increase a transferred amount.

The misting of the printing paste can be smoothly moved from the bent banks on one side 21 and the bent banks on the other side 22 to the base end portions of the banks on one side 21 and the bent banks on the other side 22, that is, portions where the banks on one side 21 and the banks on the other side 22 are connected to side edges, and in an edge portion (side edge along the printing direction) of the graphic pattern, transferring can be stabilized to improve the linearity.

Third Embodiment

Figure 5:
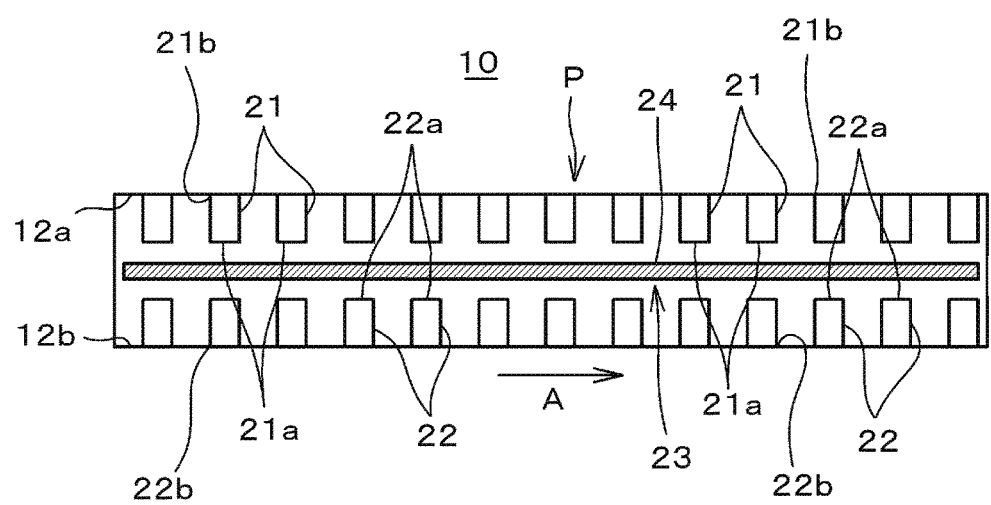
FIG. 5 is a view showing still another example of a printing pattern constituting a printing plate of an embodiment of the present disclosure.

FIG. 5 is a view showing a printing plate of still another embodiment (the third embodiment) of the present disclosure.

In a printing pattern P constituting a printing plate of the third embodiment, one recessed portion (groove) 24 which is deeper than other regions in the cell portion 23 is arranged in a direction along the printing direction between the tip portions 21*a* of the banks on one side 21 and the tip portions 22*a* of the banks on the other side 22, respectively constituting the printing pattern P of the first embodiment described above. In addition, a depth of the recessed portion (groove) 24 is preferably at least 1.5 times and at most 3 times deeper than that of other regions in the cell portion 23.

In the case of the printing pattern of the first embodiment, when a width of the graphic pattern is 100 μm or less, a volume of the cell portion 23 is small and a transferred amount of the printing paste is small and therefore a film thickness of the printing pattern (printing figure) tends to be small. When a width of the graphic pattern is more than 100 μm, a thickness of coated film of a central portion tends to be insufficient compared with a film thickness of an edge portion. However, it becomes possible to increase a transferred amount of the printing paste from the cell portion 23 by forming, in a center in a width direction of the cell portion 23, a recessed portion (groove) 24 which is deeper than other regions in the cell portion 23 like this third embodiment. Therefore it is possible to prevent the film thickness of the printing pattern from being small when a width of the graphic pattern is 100 μm or less, and it is possible to resolve a problem of insufficient film thickness of a center of the graphic pattern when a width of the graphic pattern is more than 100 μm.

Fourth Embodiment

Figure 6:
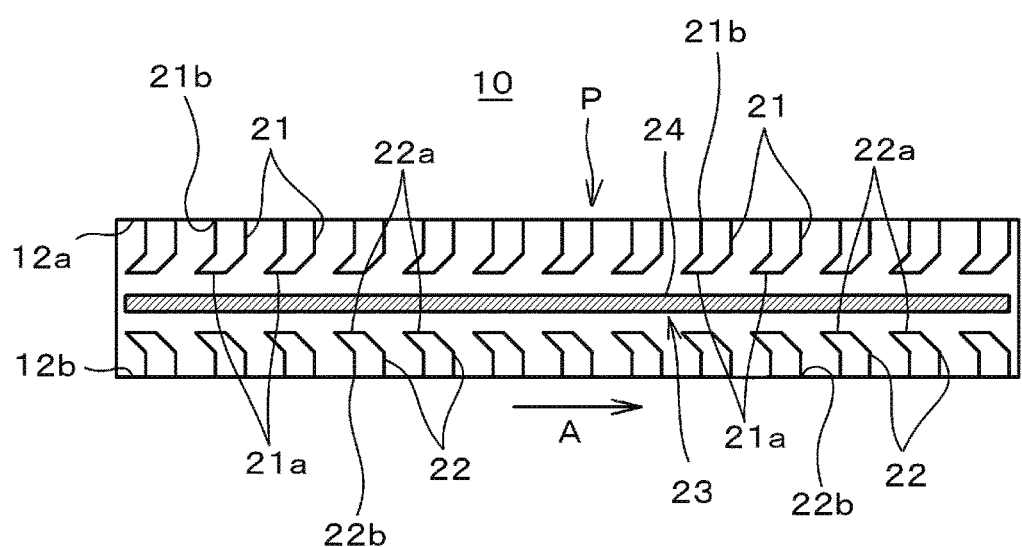
FIG. 6 is a view showing still another example of a printing pattern constituting a printing plate of an embodiment of the present disclosure.

FIG. 6 is a view showing a printing plate of still another embodiment (the fourth embodiment) of the present disclosure.

In a printing pattern P constituting a printing plate of the fourth embodiment, one recessed portion (groove) 24 which is deeper than other regions in the cell portion 23 is arranged in a direction along the printing direction between the tip portions 21a of the banks on one side 21 and the tip portions 22a of the banks on the other side 22, respectively constituting the printing pattern P of the second embodiment described above. In addition, a depth of the recessed portion (groove) 24 is preferably at least 1.5 times and at most 3 times deeper than that of the cell portion 23.

In the case of the printing pattern of the second embodiment, when a width of the graphic pattern is 100 μm or less, a volume of the cell portion 23 is small and a transferred amount of the printing paste is small and therefore a film thickness of the printing pattern tends to be small. When a width of the graphic pattern is more than 100 μm, a thickness of coated film of a central portion tends to be insufficient compared with a film thickness of an edge portion. However, it becomes possible to increase a transferred amount of the printing paste from the cell portion 23 by forming, in a center in a width direction of the cell portion 23, a recessed portion (groove) 24 which is deeper than other regions in the cell portion 23 like this fourth embodiment. Therefore it is possible to prevent the film thickness of the printing pattern from being small when a width of the graphic pattern is 100 μm or less, and it is possible to resolve a problem of insufficient film thickness of a center of the graphic pattern when a width of the graphic pattern is more than 100 μm.

Fifth Embodiment

Figure 7:
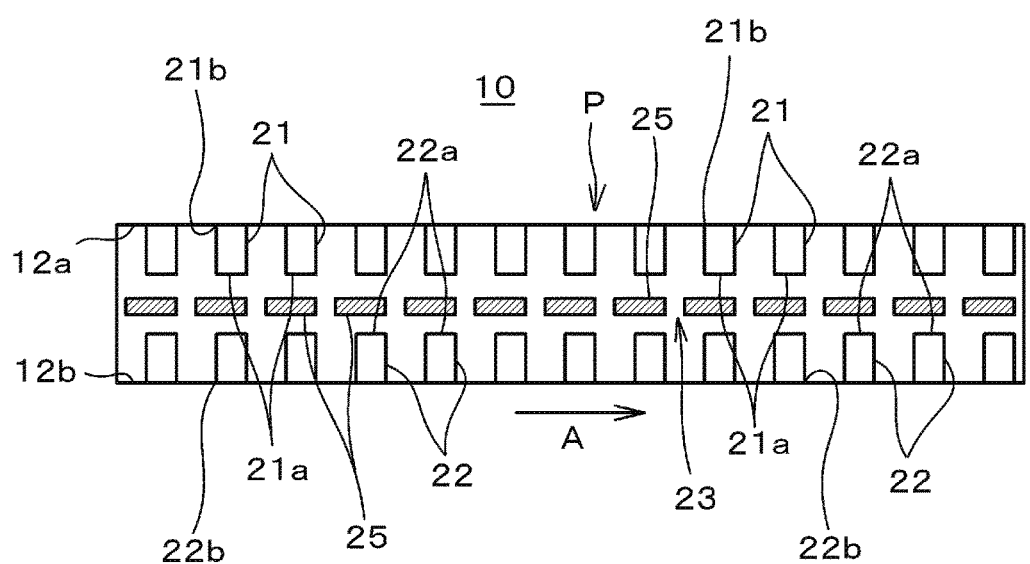
FIG. 7 is a view showing still another example of a printing pattern constituting a printing plate of an embodiment of the present disclosure.

FIG. 7 is a view showing a printing plate of still another embodiment (the fifth embodiment) of the present disclosure.

In a printing pattern P constituting a printing plate of the fifth embodiment, each of a plurality of recessed portions 25 which are deeper than other regions in the cell portion 23 is formed for each of locations between the tip portions 21a of the banks on one side 21 and the tip portions 22a of the banks on the other side 22, respectively constituting the printing pattern P of the first embodiment described above. In addition, a depth of the recessed portion 25 is preferably at least 1.5 times and at most 3 times deeper than that of the cell portion 23.

In the printing plate 10 of the fifth embodiment, the effect similar to the third embodiment described above can be achieved.

Further, but not particularly shown, it is possible to employ a configuration in which each of the plurality of recessed portions 25 which are deeper than other regions in the cell portion 23 is formed for each of locations between bending tip portions 21a of the banks on one side 21 and bending tip portions 22a of the banks on the other side 22, respectively constituting the printing pattern P of the second embodiment described above. In this case, the effect similar to the fourth embodiment described above can be achieved.

Sixth Embodiment

Figure 8:
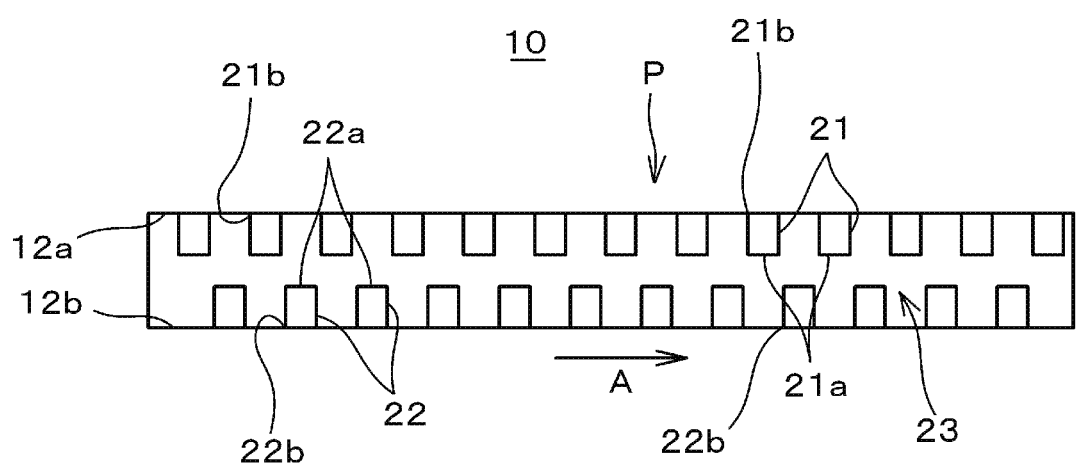
FIG. 8 is a view showing still another example of a printing pattern constituting a printing plate of an embodiment of the present disclosure.

FIG. 8 is a view showing a printing plate of still another embodiment of the present disclosure.

In a printing pattern P constituting a printing plate 10 of the sixth embodiment, banks on one side 21 and banks on the other side 22 protrude in a direction orthogonal to a printing direction toward an edge on the other side 12b and an edge on one side 12a, respectively, and each of the plurality of banks on one side 21 and each of the plurality of banks on the other side 22 are arranged at a position not confronting each other.

That is, in the sixth embodiment, the arrangement pitches of the plurality of banks on one side 21 and the arrangement pitches of the plurality of banks on the other side 22 are the same; however, each of the banks on one side 21 and each of the banks on the other side 22 are arranged at positions deviated by one-half of a pitch from each other.

Since in the printing plate 10 of the sixth embodiment, as described above, each of the banks on one side 21 and each of the banks on the other side 22 are arranged at positions deviated by one-half of a pitch from each other and arranged at a position not confronting each other, it is possible to reduce a dimension of a width direction of the printing pattern P to about 60 μm, for example, while ensuring a spacing of 30 μm or more between the bank on one side 21 and the bank on the other side 22, and ensuring a spacing of 30 μm or more between the tip portion 21a of the bank on one side 21 and the edge on the other side 12b and a spacing of 30 μm or more between the tip portion 22a of the bank on the other side 22 and the edge on one side 12a. Therefore, a printing plate having excellent adaptability to the case of printing a narrow graphic pattern can be provided.

In addition, by performing printing using the printing plate 10 of the sixth embodiment, it becomes possible to form a narrow graphic pattern having a width of about 30 μm, for example, and having excellent linearity of a side edge along the printing direction, which is not necessarily easily formed when the printing plate of the first embodiment is used.

Seventh Embodiment

Figure 9:
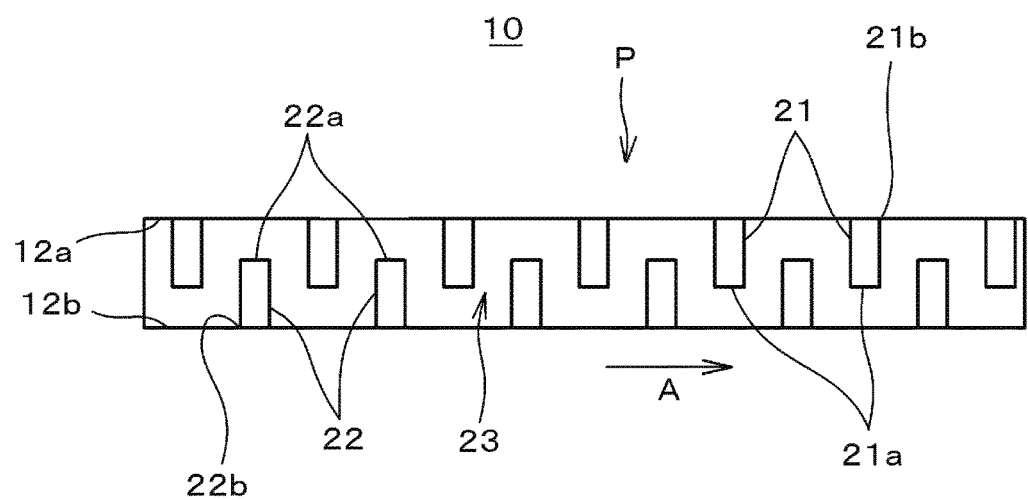
FIG. 9 is a view showing still another example of a printing pattern constituting a printing plate of an embodiment of the present disclosure.

FIG. 9 is a view showing a printing plate of still another embodiment of the present disclosure.

A printing pattern P constituting a printing plate 10 of the seventh embodiment is preferably configured such that a tip 21a of a bank on one side 21 overlaps a tip 22a of a bank on the other side 22 in viewing the printing pattern P in a direction along a printing direction. That is, in the printing plate 10 of the seventh embodiment, lengths (dimensions in a direction orthogonal to the printing direction) of the banks on one side 21 and the banks on the other side 22 exceed a half dimension in a width direction of the printing pattern P, and therefore the tip portions 21a of the banks on one side 21 penetrate to a position closer to the edge on the other side 12b than a line connecting the tip portions 22a of the banks on the other side 22, and the tip portions 22a of the banks on the other side 22 penetrate to a position closer to the edge on one side 12a than a line connecting the tip portions 21a of the banks on the other side 21.

Further, the printing pattern P is configured such that arrangement pitches of the banks on one side 21 and the banks on the other side 22 are larger than those of the sixth embodiment, for example. As a result of this, a distance (spacing) between the banks can also be adequately ensured when the printing pattern P is formed such that lengths of the banks on one side 21 and the banks on the other side 22 are longer than one-half of a dimension in a width direction of the printing pattern P. The printing plate of the seventh embodiment can adapt to the case in which a narrow graphic pattern having a width of about 50 μm, for example, is formed.

In the case of the printing plate 10 of the seventh embodiment, since the arrangement pitches of the banks on one side 21 and the banks on the other side 22 in the printing pattern P are large and therefore a ratio of an area of a cell portion 23 to a total area of the banks on one side 21 and the banks on the other side 22 is increased, a graphic pattern having excellent planarization property can be obtained.

Eighth Embodiment

Figure 10:
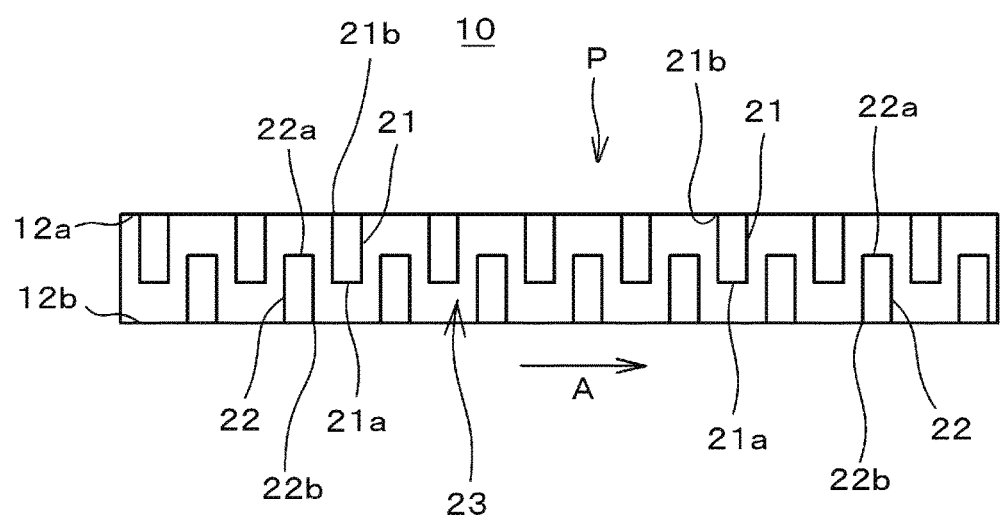
FIG. 10 is a view showing still another example of a printing pattern constituting a printing plate of an embodiment of the present disclosure.

FIG. 10 is a view showing a printing plate of still another embodiment (the eighth embodiment) of the present disclosure. A printing pattern P constituting a printing plate of the eighth embodiment is formed by reducing arrangement pitches of the banks on one side 21 and the banks on the other side 22 of the seventh embodiment described above to such an extent that a spacing of 30 μm or more between banks (e.g., a distance between a tip portion 21a of the bank on one side 21 and a tip portion 22a of the bank on the other side 22) is ensured.

With this configuration, it is possible to generate misting consecutively at the banks on one side 21 and the banks on the other side 22 in a staggered arrangement during transferring the printing paste. As a result of this, when a narrow graphic pattern having a width of about 60 μm, for example, is formed, it becomes possible to form a graphic pattern having excellent linearity of a side edge along the printing direction and being stably smooth, and it becomes possible to impart a required thickness to the graphic pattern.

Further, when arrangement pitches of the banks on one side 21 and the banks on the other side 22 are large like the seventh embodiment described above, the linearity of a side edge along the printing direction tends to be deteriorated; however, the linearity of a side edge along the printing direction can be improved by reducing the pitches of the banks on one side 21 and the banks on the other side 22 like the printing plate 10 of the eighth embodiment.

Ninth Embodiment

Figure 11:
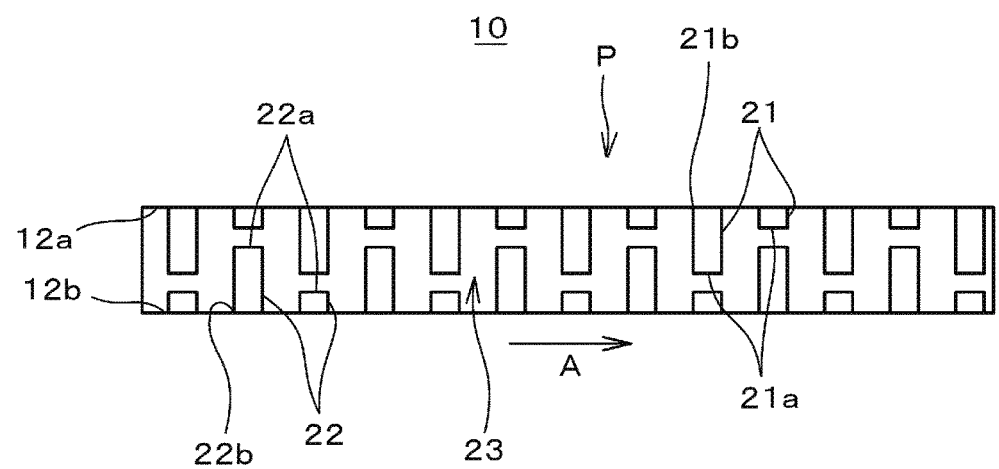
FIG. 11 is a view showing still another example of a printing pattern constituting a printing plate of an embodiment of the present disclosure.

FIG. 11 is a view showing a printing plate of still another embodiment (the ninth embodiment) of the present disclosure.

In a printing pattern P constituting a printing plate 10 of the ninth embodiment, each of banks on the other side 22 in which a length, a dimension in a direction orthogonal to the printing direction, is short, is disposed at a position opposite to each of the banks on one side 21 having a long length, and each of the banks on the other side 22 having a long length is disposed at a position opposite to each of the banks on one side 21 having a short length. In other words, each of the banks on one side 21 having a short length is disposed at a position opposite to each of the banks on the other side 22 having a long length, and each of the banks on one side 21 having a long length is disposed at a position opposite to each of the banks on the other side 22 having a short length.

In the printing plate 10 of the ninth embodiment, a spacing of 30 μm or more between the banks is configured to be ensured.

In the case of the printing plate 10 of the ninth embodiment, it becomes possible to reduce the arrangement pitches of the banks on one side 21 and the banks on the other side 22 without significantly reducing a ratio of an area of a cell portion 23 to a total area of the banks on one side 21 and the banks on the other side 22 in the printing pattern P. Thus, it becomes possible to improve the linearity of a side edge along the printing direction of the printing pattern.

In addition, FIG. 12 to FIG. 15 are views showing variations of printing plates of the above-mentioned embodiments.

Figure 12:
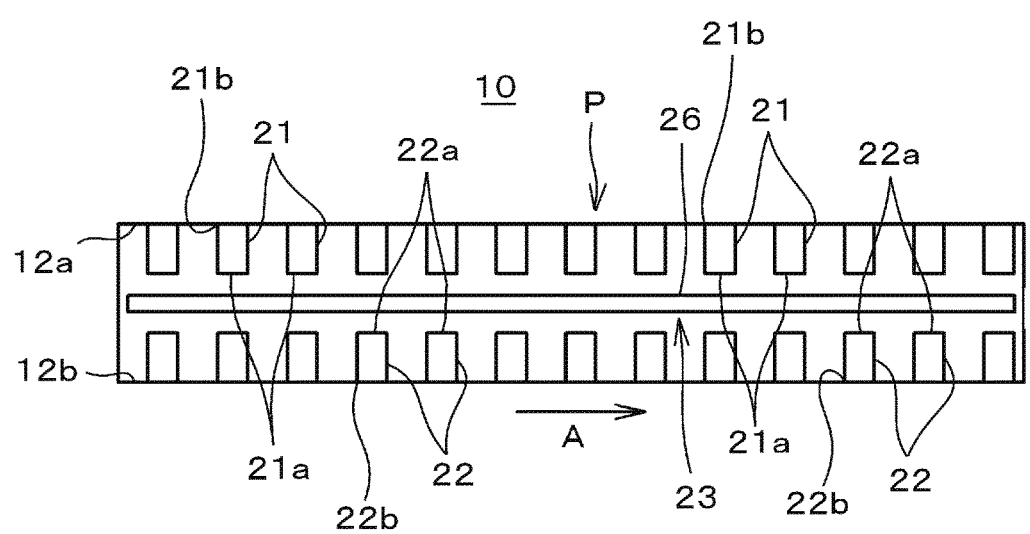
FIG. 12 is a view showing a variation of a printing pattern constituting a printing plate of an embodiment of the present disclosure.

A printing plate 10 of FIG. 12 is configured by forming one printing-direction bank 26 continuing from a beginning side of printing to an ending side of printing between banks on one side 21 and banks on the other side 22, respectively constituting a printing pattern P. The printing pattern P is a printing pattern suitable for printing of a graphic pattern having a relatively large dimension in which a width, a dimension in a direction orthogonal to the printing direction, is 100 μm or more and 300 μm or less.

That is, in a relatively wide printing pattern having a width of 100 μm or more and 300 μm or less, transferring tends to progress only in a peripheral portion of a figure to lead to an insufficient thickness of a central portion (insufficient thickness of coated film) of the printing pattern only by arranging the banks on one side 21 and the banks on the other side 22; however, by locating the printing-direction bank 26 between the banks on one side 21 and the banks on the other side 22, a trigger of transferring in the central portion increases to resolve the insufficient thickness of a central portion of the printing pattern.

In addition, in the printing pattern P of FIG. 12, the shortest distance between the printing-direction bank 26 and the bank on one side 21 or the bank on the other side 22 is preferably 30 μm or more, and a distance between the tips of the bank on one side 21 or the bank on the other side 22 is preferably 70 μm or more.

Figure 13:
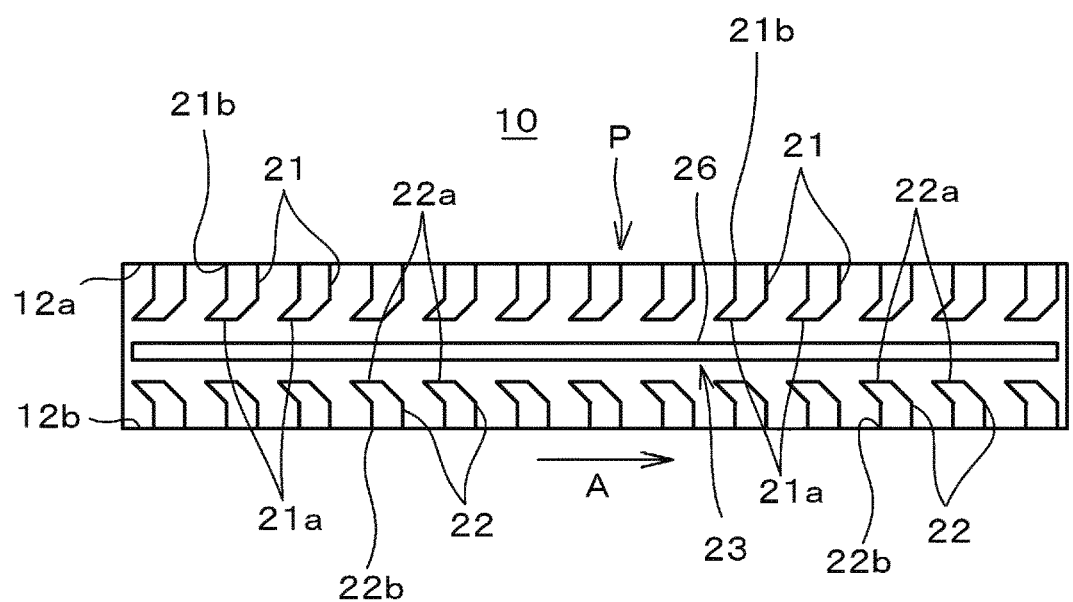
FIG. 13 is a view showing another variation of a printing pattern constituting a printing plate of an embodiment of the present disclosure.

Further, the printing plate 10 of FIG. 13 is configured by forming one printing-direction bank 26 continuing from a beginning side of printing to an ending side of printing in a direction along the printing direction between the banks on one side 21 having tip portions 21a bending toward an upstream side of the printing direction and the banks on the other side 22 having tip portions 22b bending toward an upstream side of the printing direction. The printing pattern P is a printing pattern suitable for printing of a graphic pattern having a relatively large dimension in which a width, a dimension in a direction orthogonal to the printing direction, is 100 μm or more and 300 μm or less.

That is, in a relatively wide printing pattern having a width of 100 μm to 300 μm, transferring tends to progress only in a peripheral portion of a figure to lead to an insufficient thickness of a central portion (insufficient thickness of coated film) of the printing pattern only by arranging the banks on one side 21 and the banks on the other side 22; however, by locating the printing-direction bank 26 between the banks on one side 21 and the banks on the other side 22, a trigger of transferring in the central portion increases to resolve the insufficient thickness of a central portion (insufficient thickness of coated film) of the printing pattern.

In addition, in the printing pattern P of FIG. 13, the shortest distance between the printing-direction bank and the bank on one side 21 or the bank on the other side 22 is preferably 30 μm or more, and a distance between the tips of the bank on one side 21 or the bank on the other side 22 is preferably 70 μm or more.

Figure 14:
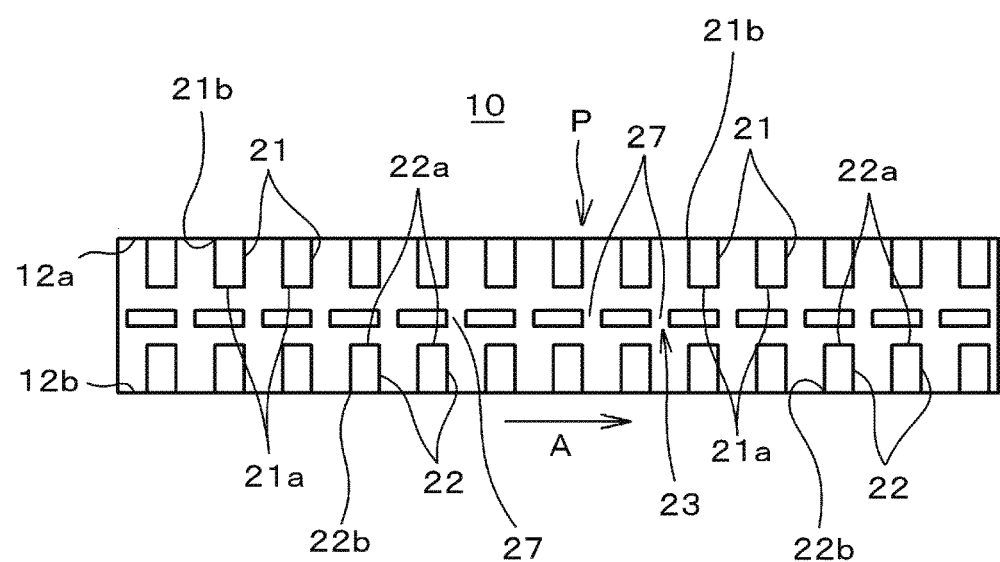
FIG. 14 is a view showing still another variation of a printing pattern constituting a printing plate of an embodiment of the present disclosure.

Further, the printing plate 10 of FIG. 14 is configured by forming notches (slits) 27 at predetermined intervals in the printing direction on one printing-direction bank 26 continuing from a beginning side of printing to an ending side of printing in the printing pattern P of FIG. 12.

By configuring the printing pattern like the printing pattern P of FIG. 14, it is possible to increase a ratio of the cell portion 23 in the printing pattern P to ensure a transferred amount of the printing paste and prevent an applied thickness in a center of a coated film from decreasing. That is, when a continued printing-direction bank 26 without notches is disposed, the ratio of the cell portion 23 is reduced and a transferred amount of the printing paste to a center of the printing pattern becomes insufficient; however, by configuring the printing pattern like the printing pattern P of FIG. 14, such a problem can be resolved.

Figure 15:
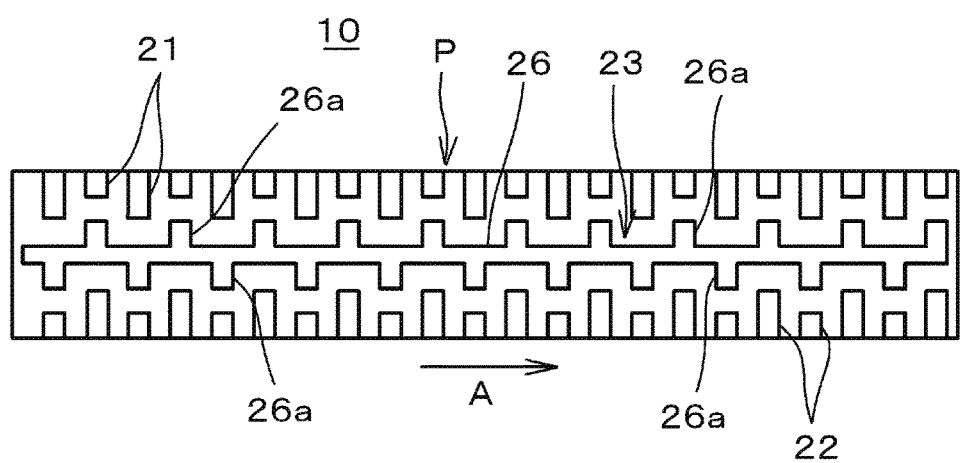
FIG. 15 is a view showing still another variation of a printing pattern constituting a printing plate of an embodiment of the present disclosure.

Further, the printing plate 10 of FIG. 15 is suitable for the case in which a distance between the tips of the bank on one side 21 and the bank on the other side 22 is 100 μm or more. In the printing pattern P constituting the printing plate 10, each of banks on the other side 22 in which a length, a dimension in a direction orthogonal to the printing direction, is long, is disposed at a position opposite to each of the banks on one side 21 having a long length, and each of the banks on the other side 22 having a long length is disposed at a position opposite to each of the banks on one side 21 having a short length (that is, each of the banks on one side 21 having a short length is disposed at a position opposite to each of the banks on the other side 22 having a long length, and each of the banks on one side 21 having a long length is disposed at a position opposite to each of the banks on the other side 22 having a short length), and a bank (printing-direction bank) 26 continuing from a beginning side of printing to an ending side of printing is formed between the banks on one side 21 and the bank on the other side 22. Further, protruded banks (one-side protruded banks) 26a protruding toward short banks on one side 21 or short banks on the other side 22 are arranged in regions, opposite to the short banks on one side 21 and the short banks on the other side 22, of the printing-direction bank 26.

In addition, in the printing pattern P, it is also preferred that a spacing of 30 μm or more between the banks is ensured.

In the case of forming a narrow graphic pattern having a relatively large width up to about 300 μm like the printing plate 10 of FIG. 15, when a printing-direction bank 26 having a configuration in which the above-mentioned protruded banks (one-side protruded banks) 26a are provided, is arranged, a trigger of transferring of the printing paste increases by the protruded bank 26a to increase a transferred amount and an insufficient thickness of the printing pattern is resolved.

Figure 16:
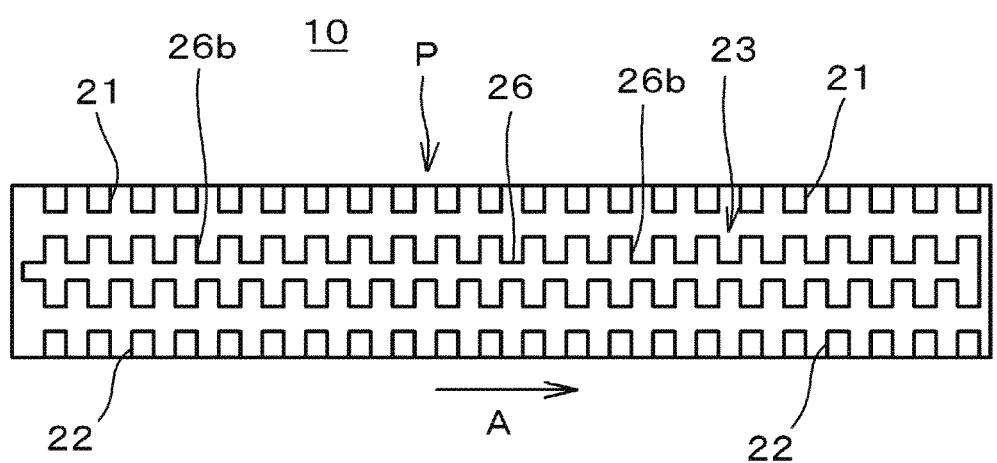
FIG. 16 is a view showing still another variation of a printing pattern constituting a printing plate of an embodiment of the present disclosure.
Figure 17:
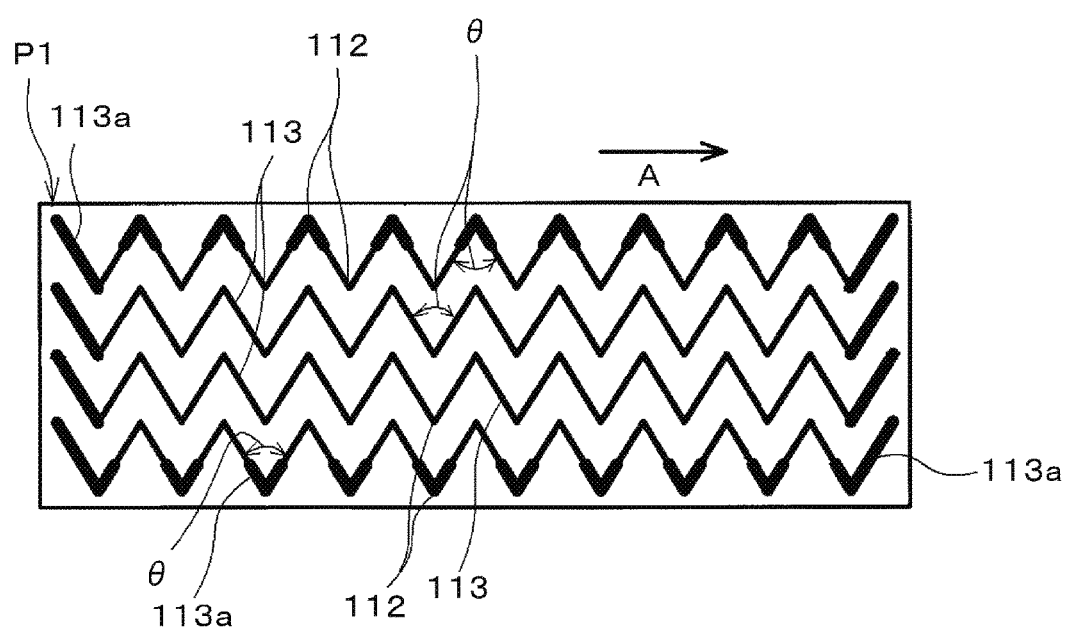
FIG. 17 is a view showing a printing pattern constituting a conventional printing plate.
Figure 18:
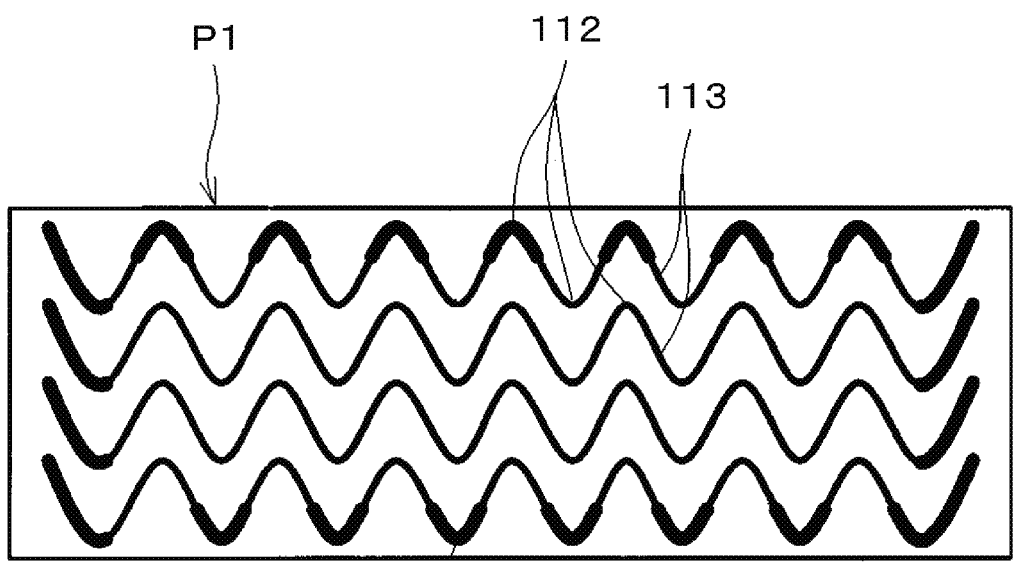
FIG. 18 is a view showing another example of a printing pattern constituting a conventional printing plate.
Figure 19:
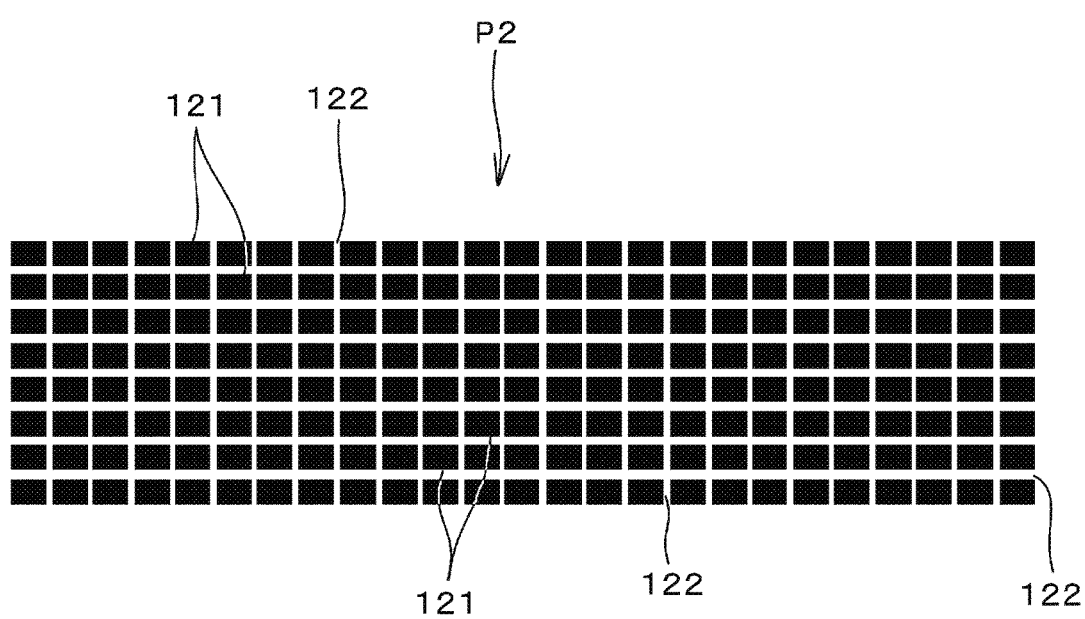
FIG. 19 is a view showing still another example of a printing pattern constituting a conventional printing plate.
Figure 20:
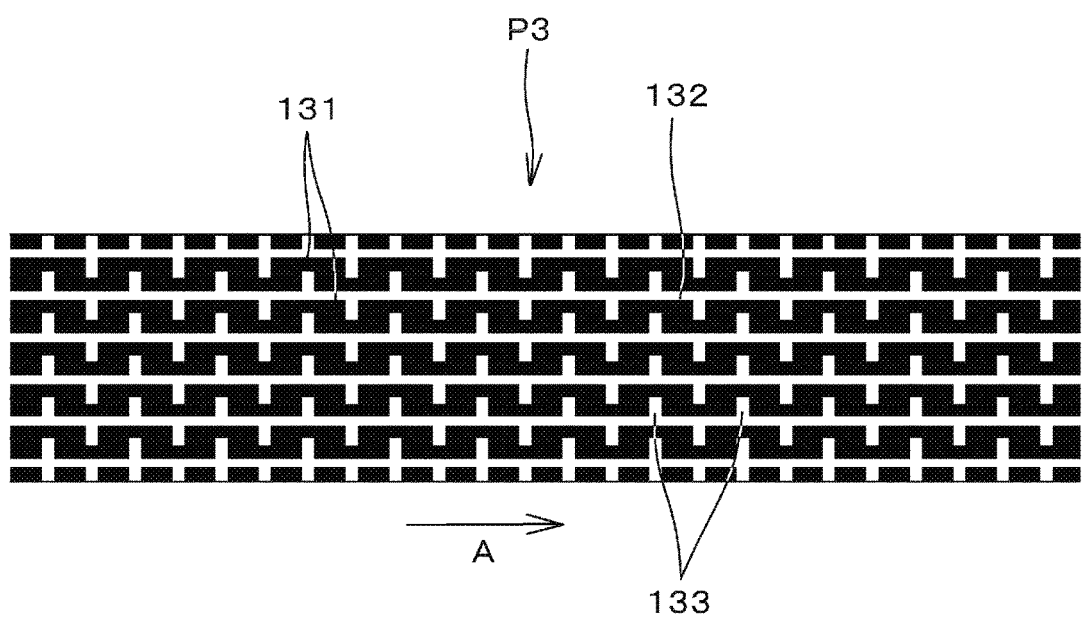
FIG. 20 is a view showing still another example of a printing pattern constituting a conventional printing plate.

Further, the printing pattern P constituting the printing plate 10 of FIG. 16 is suitable for the case in which a distance between the tips of the bank on one side 21 or the bank on the other side 22 is 100 μm or more as with the printing pattern P constituting the printing plate 10 of FIG. 15. In the printing pattern P constituting the printing plate 10, the banks on one side 21 and the banks on the other side 22, respectively constituting the printing pattern P, in which lengths, dimensions in a direction orthogonal to the printing direction, are the same, are arranged at positions confronting each other, and a bank (printing-direction bank) 26 continuing from a beginning side of printing to an ending side of printing is formed between the banks on one side 21 and the banks on the other side 22. Protruded banks (two-side protruded banks) 26b protruding toward the banks on one side 21 and the banks on the other side 22 are arranged in regions, opposite to the banks on one side 21 and the banks on the other side 22, of the printing-direction bank 26.

In addition, in the printing pattern, it is also preferred that a spacing of 30 μm or more between the banks is ensured.

In the case of forming a narrow graphic pattern having a relatively large width up to about 300 μm like the printing plate 10 of FIG. 16, when a printing-direction bank 26 having a configuration in which the above-mentioned protruded banks (two-side protruded banks) 26b are provided, is arranged, a trigger of transferring of the printing paste increases by the protruded bank 26b to increase a transferred amount and an insufficient thickness of the printing pattern (coated film) is resolved.

In addition, in the printing plate of the present disclosure, a configuration in which characteristic configurations of embodiments described above are combined into one may be employed.

Further, in the above embodiments, the present disclosure has been described taking, as an example, the case of applying the conductive paste for formation of an internal electrode pattern for a multilayer ceramic capacitor, but the present disclosure is widely applicable to the case of forming an electrode pattern in the case in which various electronic components other than the multilayer ceramic capacitor are manufactured.

Further, the printing plate of the present disclosure is applicable to the case of applying various pastes (printing pastes) such as a ceramic paste, a dielectric paste and a resistance paste, not limited to the conductive paste.

Further, in the above embodiments, an example in which a gravure roll is used as the printing plate has been described; however, a flat printing plate in which a printing pattern is formed on a flat plate material may be used.

Further, the printing plate of the present disclosure is applicable to the whole intaglio printing including an offset printing method.

For example, when the offset printing method is implemented, it is also possible that intermediate transferring bodies (for example, blanket roll) are arranged so as to abut against both of the printing plate and a material to be printed, and a printing paste filled into a printing pattern of the printing plate is transferred to the material to be printed through the intermediate transferring bodies.

The present disclosure is not intended to be limited to the above-mentioned embodiments in other points, and various applications and variations may be made within the scope of the disclosure.

What is claimed is:

1. A printing plate for intaglio printing for applying a printing paste onto a printing object so as to form a predetermined graphic pattern, said printing plate comprising
a plurality of printing patterns corresponding to the predetermined graphic pattern to be printed being formed on a surface of a plate material,
the printing pattern including
a plurality of banks on one side protruding from an edge on the one side along a printing direction in which printing is advanced toward an edge on the other side opposite to the edge on one side and arranged at predetermined intervals in the printing direction,
a plurality of banks on the other side protruding from the edge on the other side toward the edge on the one side and arranged at predetermined intervals in the printing direction, and
a cell portion being a region to be filled with the printing paste, the region except for regions occupied by the banks on the one side and the banks on the other side.

2. The printing plate according to claim 1, wherein the banks on the one side and the banks on the other side protrude in a direction orthogonal to the printing direction toward the banks on the other side and the banks on the one side, respectively.

3. The printing plate according to claim 1, wherein each of the plurality of banks on the one side and each of the plurality of banks on the other side are arranged at a position confronting each other in a direction orthogonal to the printing direction.

4. The printing plate according to claim 1, wherein each of the plurality of banks on the one side and each of the plurality of banks on the other side are arranged at a position not confronting each other in a direction orthogonal to the printing direction.

5. The printing plate according to claim 1, wherein the printing pattern is configured such that a tip region of the bank on the one side does not overlap a tip of the bank on the other side in viewing the printing pattern in a direction along the printing direction.

6. The printing plate according to claim 4, wherein the printing pattern is configured such that a tip of the bank on the one side overlaps a tip of the bank on the other side in viewing the printing pattern in a direction along the printing direction.

7. The printing plate according to claim 1, wherein the tips of the banks on the one side and the tips of the banks on the other side bend toward an upstream side of the printing direction.

8. The printing plate according to claim 1, wherein dimensions of the banks on the one side adjacent to each other which are directed from base end portions toward the edge on the other side are different, and dimensions of the banks on the other side adjacent to each other which are directed from base end portions toward the edge on the one side are different.

9. The printing plate according to claim 1, wherein the printing pattern is configured such that spacings between the banks on the one side are constant and spacings between the banks on the other side are constant.

10. The printing plate according to claim 1, wherein a recessed portion which is deeper than other regions is provided in a region of a bottom of the cell portion.

11. A printing device comprising the printing plate according to claim 1.

12. A method for manufacturing a laminated ceramic electronic component comprising a step of applying a conductive paste as a printing paste, onto one of a ceramic green sheet and a carrier film using the printing plate according to claim 1 to form a graphic pattern for an internal electrode.

* * * * *